United States Patent [19]
Morishima et al.

[11] Patent Number: 5,258,326
[45] Date of Patent: Nov. 2, 1993

[54] QUANTUM DEVICE FABRICATION METHOD

[75] Inventors: Mitsukata Morishima; Toshiroh Hayakawa, both of Yokohama, Japan

[73] Assignee: Eastman Kodak Company, Rochester, N.Y.

[21] Appl. No.: 858,733

[22] Filed: Mar. 27, 1992

[30] Foreign Application Priority Data

May 28, 1991 [JP] Japan .................................. 3-121721

[51] Int. Cl.$^5$ ......................................... H01L 21/203
[52] U.S. Cl. .................................... 437/107; 437/105; 156/612
[58] Field of Search ........................... 437/107, 86, 81; 156/612; 257/9

[56] References Cited

U.S. PATENT DOCUMENTS

4,797,374 1/1989 Scott et al. ........................... 156/612

OTHER PUBLICATIONS

"Growth mechanism of GaAs during migration enhanced epitaxy at low growth tempertures" by Yoshiji Horekoshi and Minora Kawashima in Jap. Jr. Appl. Physics vol. 28(2), 200–209 (1989).

Applied Physics Letters, vol. 56, p. 2642 (1990) by J. A. Lebens, C. S. Tsai, K. J. Vabala and T. F. Kuech.

*Primary Examiner*—Olik Chaudhuri
*Assistant Examiner*—Ramamohan Rao Paladugu
*Attorney, Agent, or Firm*—Raymond L. Owens

[57] ABSTRACT

The present invention is directed to a method of fabricating quantum devices such as quantum boxes and quantum wires measuring as small as several tens of nanometers utilizing selectivity based on crystal plane orientation. A substrate is provided with a surface having an (100) crystal plane orientation. A first layer of a semiconductor material, such as AlGaAs or GaAs, is epitaxially grown on the surface of the substrate as a trapezoid having a (100) crystal plane orientation top surface and a (111)B crystal plane orientation side surface around the top surface. An As$_2$ beam is used for MBE growth of a second layer of GaAs or InGaAs on the (100) surface of the first layer. The growth of the third layer on the (111)B crystal plane orientation region is prevented by an As trimer structure such that growth only takes place at the (100) crystal plane orientation region.

17 Claims, 3 Drawing Sheets

QUANTUM DEVICE FABRICATION METHOD

FIELD OF THE INVENTION

The present invention relates to a quantum device fabrication method, and, more particularly, to a method of using crystal growth to fabricate quantum devices such as quantum wires and quantum boxes.

BACKGROUND OF THE INVENTION

In recent years attention has focussed on quantum devices with ultrafine structures, such as quantum wires and quantum boxes, and on methods of fabricating such devices. Quantum devices are well known and are devices in which carriers (electrons and/or holes) are confined into a small part of the device in one, two and three dimensions, respectively. The dimensions of such devices are sufficiently small, in the order of 10 nm, so as to be comparable to the wavelength of electrons and holes. Thus, the electrons and holes behave not only as particles, but also as waves. Fabricating methods that have been used include those involving combinations of wet and dry etching techniques. Ion-beam technology has also been used to fabricate submicron quantum devices.

The application of selective epitaxial growth techniques for the fabrication of nanometric-scale capillary tubes and boxes has been disclosed, for example in an article in APPLIED PHYSICS LETTERS, Vol. 56, Pg. 2642 (1990), by J. A. Lebens, C. S. Tsai, K. J. Vabala and T. F. Kuech. This article describes using metal-organic vapor-phase epitaxy to grow a layer of AlGaAs on a GaAs substrate with a (100) oriented surface, and using a SiN mask layer and electron-beam lithography and etching to form tubes from 90 nm to 300 nm wide and boxes 70 nm to 300 nm in diameter. However, constraints relating to etching ratios and the size of the ion beam impose limits on the degree of submicron fabrication achievable with such techniques. This makes it difficult to fabricate quantum wires and boxes that are finer and have a good interface.

SUMMARY OF THE INVENTION

The present invention provides a method of fabricating ultrafine quantum devices that are as small as several tens of nanometers and also have a good interface structure.

The method of the present invention for making a quantum device comprises forming on a surface of a substrate of a semiconductor material a first semiconductor layer having an ultrafine region. The first layer has a first surface of a first crystalline plane orientation and a second surface of a second crystalline plane orientation around the first surface. A second semiconductor layer is formed only on the first surface of the first semiconductor layer using an epitaxy deposition technique which substantially grows the second semiconductor layer only on the first surface with the first crystalline plane orientation based on differences in selectivity between the first and second crystalline plane orientation.

The invention will be better understood from the following more detailed description taken with the accompanying drawings and claims.

The drawings are not necessarily to scale.

DETAILED DESCRIPTION

Figure 1:
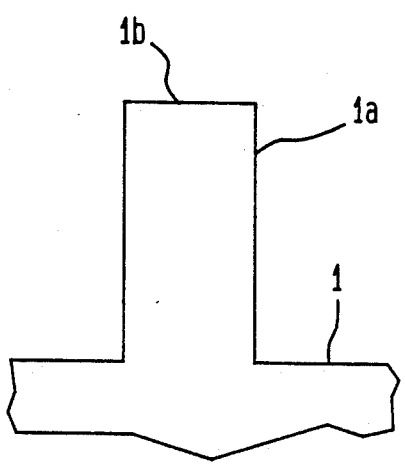
FIGS. 1-4 are cross-sectional views illustrating steps of a process in accordance with the present invention for making an ultrafine quantum device.
Figure 2:
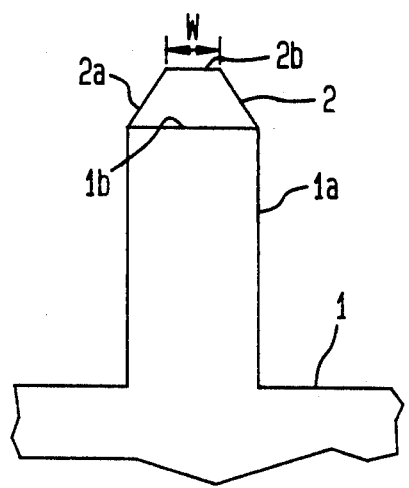

Referring initially to FIGS. 1-4, there are shown cross-sectional views illustrating steps of a method in accordance with the present invention. With reference first to FIG. 1, using dry etching or the like, a region 1a 0.5 um wide and 1 μm high in a reverse mesa direction is formed on a GaAs substrate 1 having a surface 1b with a (100) crystal plane orientation. The method continues as shown in FIG. 2. Using this GaAs substrate 1 with the (100) crystal plane orientation, molecular beam epitaxy (MBE) with a As$_4$ beam, which is produced by means of a normal K cell, is used to form on the substrate surface 1b a first semiconductor layer 2 of Al$_{0.3}$Ga$_{0.7}$As which is about 200 nm in thickness. The Al$_{0.3}$Ga$_{0.7}$As first layer 2 is formed as a trapezoid bounded by a (111)B crystal plane orientation side surface region 2a around a (100) crystal plane orientation top surface region 2b. The (111)B surface is the (111) oriented plane of the topmost GaAs surface on which Ga appears.

Figure 3:
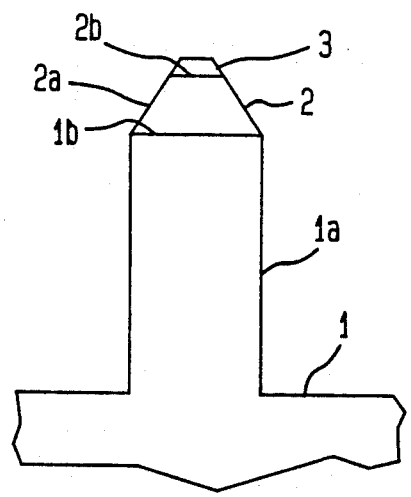

As shown in FIG. 3, a second layer 3 of GaAs having a thickness of about 20 nm is then formed on the surface region 2b. This is achieved by MBE with an As$_2$ beam, for example, obtained by using a solid As source cracker cell to crack an As$_4$ beam, and a beam of Ga. As the surface of the (111)B crystal plane orientation surface region 2a of the Al$_{0.3}$Ga$_{0.7}$As layer 2 is stabilized by an As trimer structure, no growth of GaAs takes place on the surface region 2a during the MBE process because of the very small coefficient of adhesion of Ga atoms.

Figure 4:
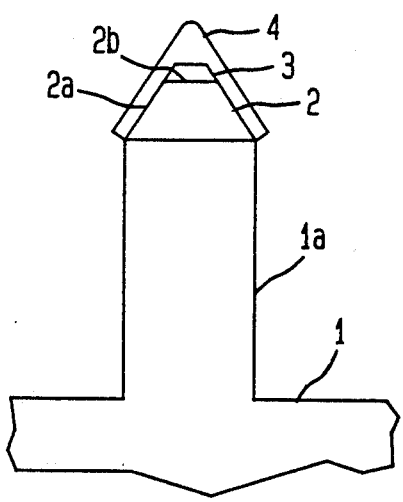

The As trimer structure formed on the GaAs (111)B surface is described in an article in PHYSICAL REVIEW LETTERS, Vol. 65, Pg. 452 (1990) by D. K. Biegelsen, R. D. Bringans, J. E. Northrop, and L. E. Swarts. This article describes an As-rich (2×2) structure constituted by an As-atom-attractive trimer. Ga atoms adhere to the Al$_{0.3}$Ga$_{0.7}$As layer 2 top surface region 2b with the (100) crystal plane orientation. This produces a growth of GaAs. The result is the formation of a GaAs layer 3 only over the top surface region 2b. Finally, as shown in FIG. 4, a switchover Al$_{0.3}$Ga$_{0.7}$As over the GaAs second layer 3 and the side surface region 2a of the layer 2. The third layer 4 produces with the GaAs second layer 3 a quantum device. A quantum wire is obtained by extending the GaAs second layer 3 perpendicularly relative to the drawing sheet.

By adjusting the growth time of the Al$_{0.3}$Ga$_{0.7}$As first layer 2, the width W of the (100) crystal plane orientation top surface region 2b can be reduced to below 0.5 um, to 50 nm for example. These conditions therefore can produce a GaAs wire 50 nm wide and 20 nm thick. However, the size of the ultrafine region can be changed in accordance with requirements by changing the thickness of the Al$_{0.3}$Ga$_{0.7}$As first layer 2. Also, while this embodiment has been described with reference to GaAs, examples of other materials that can be used include InGaAs, InAlGaP, and InGaAsP.

Instead of an $As_2$ beam obtained by means of a solid cracker cell, the quantum devices can also be fabricated using an $As_2$ or As beam obtained from a base material such as $AsH_3$ or the like. When in this case P system material is used, a $P_2$ beam may be used in place of an $As_2$ beam and a $P_4$ beam in place of an $As_4$ beam. While such group V element beams are derived from a solid source, it is also possible to use a metal-organic or other such gas source. In the case of both a group III or group V element, when a gas source is used the elimination reaction from the surface is enhanced. This increases the crystal-orientation-based selectivity, enabling devices with an even better interface to be obtained.

Figure 5:
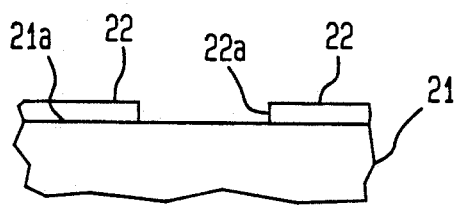
FIGS. 5-8 are cross-sectional views illustrating steps of another process in accordance with the present invention.
Figure 6:
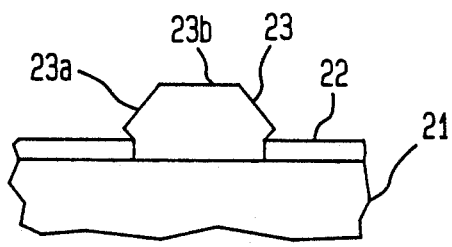

Referring now to FIGS. 5-8, there are shown cross-sectional views illustrating steps of another method in accordance with the present invention. With reference first to FIG. 5, a 50 nm thick $SiN_x$ masking layer 22 is formed on a surface 21a of a GaAs substrate 21 with the surface 21a having a (100) crystal plane orientation. The masking layer 22 is then patterned and etched in a conventional manner to provide it with an opening 22a therein which leaves a region 0.5 um wide of the surface 21a exposed in a reverse mesa direction. As is shown in FIG. 6, using this GaAs substrate 21 with the (100) crystal plane orientation surface 21a, MBE using an $As_4$ beam is used to form a 200 nm thick GaAs first layer 23. This growth produces the layer 23 having a portion in the form of a trapezoidal like structure which is bounded by a (111)B crystal plane orientation side surface region 23a and a (100) crystal plane orientation top surface region 23b.

Figure 7:
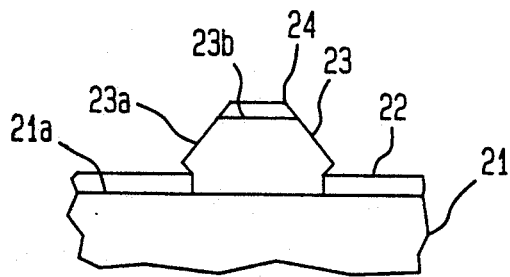
Figure 8:
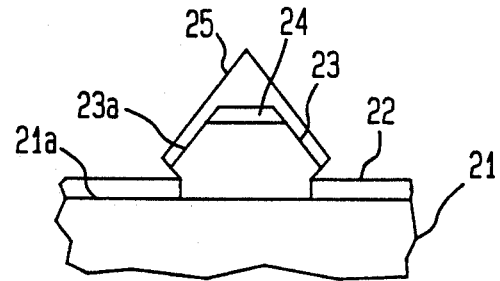

As shown in FIG. 7, a 10 nm thick $In_{0.2}Ga_{0.8}As$ second layer 24 is then formed on the surface region 23b by MBE with an $As_2$ beam obtained by cracking $AsH_3$ and beams of Ga and In. As the surface of the (111)B crystal plane orientation side surface region 23a of the GaAs layer 23 is stabilized by an As trimer structure, there is no growth of $In_{0.2}Ga_{0.8}As$ thereon. MBE growth of InGaAs does take place at the (100) crystal plane orientation top surface region 23b. This forms the InGaAs layer 24 only over the (100) crystal plane orientation top surface region 23b. As is shown in FIG. 8, a switchover is made to an $As_4$ beam to form a GaAs third layer 25 over the InGaAs second layer 24 and the side surface region 23a of the GaAs first layer 23. This produces a quantum device with $In_{0.2}Ga_{0.8}As$ layer 24.

In the same way as in the method illustrated in FIGS. 1-4, by adjusting the growth time of the GaAs first layer 23 the width of the $In_{0.2}Ga_{0.8}As$ layer 24 can be reduced to around 50 nm, providing a quantum wire with an extremely good interface. Although the method illustrated in FIGS. 5-8 has been described with reference to a $SiN_x$ 22 having a thickness of 50 nm, the thickness can be changed as required. Similarly, the invention is not limited to the use of $SiN_x$ but may use other materials such as $SiO_2$, for example. The size of the ultrafine region may be changed as required by suitably adjusting the thickness of the GaAs layer 23 or the width of the opening 22a formed by the $SiN_x$ masking layer 22 and the thickness of the $SiN_x$ masking layer 22 itself.

Figure 9:
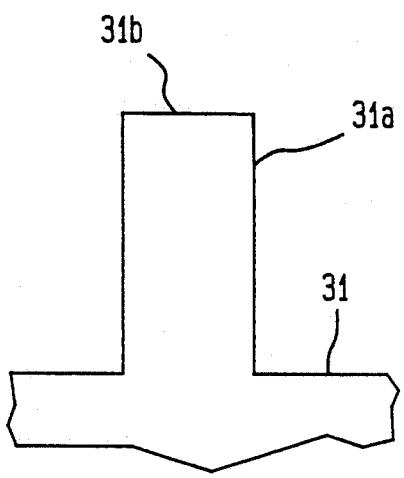
FIGS. 9-12 are cross-sectional views illustrating steps of still another process in accordance with the present invention.
Figure 10:
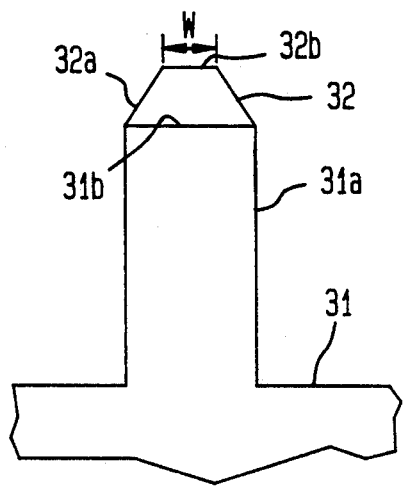

Referring now to FIGS. 9-12, there are shown cross-sectional views illustrating the steps of still another method in accordance with the present invention. As shown in FIG. 9, first, a region 31a 0.5 μm wide and 1 μm high in a reverse mesa direction is formed on a GaAs substrate 31 having a surface 31b with a (100) crystal plane orientation. As shown in FIG. 10, using this GaAs substrate 31 with the surface 31b having a (100) crystal plane orientation, a 200 nm thick $Al_{0.3}Ga_{0.7}As$ first layer 32 is then formed on the surface 31b. This can be achieved by migration enhancement epitaxy (MEE) with an $As_2$ beam, for example, obtained by using a solid As source cracker cell to crack an $As_4$ beam. Thus, the $Al_{0.3}Ga_{0.7}As$ first layer 32 is formed as a trapezoid bounded by a (111)B crystal plane orientation side surface region 32a and a (100) crystal plane orientation top surface region 32b.

Figure 11:
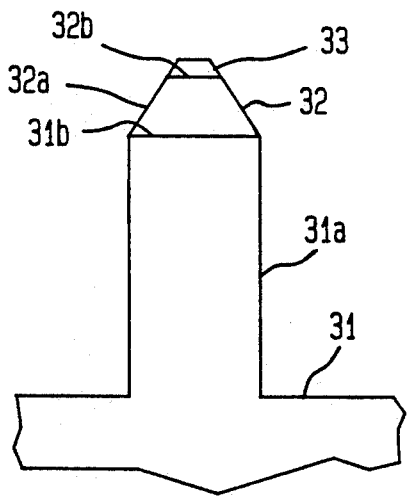

As shown in FIG. 11, a 20 nm thick GaAs second layer 33 is then formed on the surface region 32b by $As_2$ beam MBE. As the surface of the (111)B crystal plane orientation side surface region 32a of the $Al_{0.3}Ga_{0.7}As$ first layer 32 is stabilized by an As trimer structure, no growth of GaAs takes place on the side surface region 32a during the MBE process because of the very small coefficient of adhesion of Ga atoms. On the other hand, GaAs does grow on the top surface region 32b of the $Al_{0.3}Ga_{0.7}As$ first layer 32 with the (100) crystal plane orientation. The result, as shown in FIG. 11, is that the GaAs second layer 33 forms only over the top surface region 32b of the $Al_{0.3}Ga_{0.7}As$ 32 having the (100) crystal plane orientation.

Figure 12:
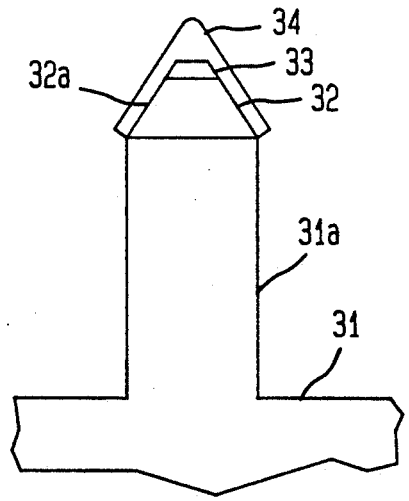

As shown in FIG. 12, an $As_2$ beam MEE is used to form an $Al_{0.3}Ga_{0.7}As$ third layer 34. No growth of GaAs takes place on the side surface region 32a. No, growth of GaAs takes place on the side surface region 32a. With this MEE process the use of a group III element alternates with the use of a group V element. Therefore, the surface of the (1114)B crystal plane orientation side surface region of the $Al_{0.3}Ga_{0.7}As$ first layer 32 is not stabilized by an As trimer structure formed thereon. As a result, $Al_{0.3}Ga_{0.7}As$ grows on the (111)B crystal plane orientation side surface region 32a as well as over the GaAs second layer 33. This forms a quantum device enclosed by the $Al_{0.3}Ga_{0.7}As$ third layer 34 as shown in FIG. 12. Details of the MEE process are provided in the JAPANESE JOURNAL OF APPLIED PHYSICS, Vol. 28 (1989), pp 200-209.

By adjusting the growth time of the $Al_{0.3}Ga_{0.7}As$ first layer 32, the width W of the (100) crystal plane orientation top surface region 32b can be reduced to 50 nm or so. This enables the production of a quantum wire having a good interface 50 nm wide and 20 nm thick.

It is to be appreciated and understood that the specific embodiments of the invention are merely illustrative of the general principles of the invention. Various modifications may be made consistent with the principles set forth. For example, as previously indicated, the composition of the various layers may be changed as well as the specific epitaxy techniques for growing the layers.

What is claimed is:

1. A method of making an ultrafine quantum device of a width of tens of nanometers with good interfaces, comprising the steps of:

furnishing a crystalline GaAs semiconductor substrate having one surface with a (100) crystalline plane orientation;

delineating on said one surface of the GaAs semiconductor substrate at least one first fine mesa region of a width of about 500 nm having said (100) crystalline plane orientation and a second surface of a second (111) B crystalline plane orientation around said first surface;

providing a second semiconductor layer only on said first surface of said first semiconductor layer using an epitaxial growth molecular beam technique which selectively grows the second semiconductor layer only on said first surface of said first (100) crystalline plane orientation based on differences in growth selectivity between said first (100) and said second (111) B crystalline plane orientations; and deposing a third semiconductor layer conformally over said second semiconductor layer and over said second surface of said first semiconductor layer, thereby making an ultrafine quantum device with good interfaces in conjunction with said second semiconductor layer.

2. The method of claim 1, wherein said delineating step comprises:

dry etching a plurality of second regions of said one surface of said GaAs semiconductor substrate to a depth of about 1000 nm to provide at least said one first fine region as an unetched mesa region having said width of about 500 and said (100) crystalline plane orientation of the mesa.

3. The method of claim 1, wherein said delineating step comprises the steps of:

deposing a $SiN_x$ masking layer on said one surface of said GaAs semiconductor substrate; and creating at least one fine opening of a width of about 500 nm in said masking layer to expose on said semiconductor substrate a corresponding first fine region if GaAs with a (100) crystal plane orientation.

4. The method of claim 1, wherein said forming step comprises:

growing said first semiconductor layer expitaxially to a thickness of about 200 nm on at least said first fine region of said GaAs semiconductor substrate.

5. The method of claim 4 in which the first semiconductor layer is of AlGaAs grown by molecular beam epitaxy (MBE) using a molecular beam source of $As_4$ and Ga and Al.

6. The method of claim 5 in which said first semiconductor layer is grown as a trapezoid having a (100) oriented crystalline plane top surface bounded by (111) B oriented crystalline side surfaces.

7. The method of claim 4 in which the first semiconductor layer is of AlGaAs grown by migration enhanced epitaxy (MEE) using a molecular beam source of $As_2$ and Al.

8. The method of claim 7 in which said first semiconductor layer is grown as a trapezoid having a (100) oriented crystalline plane top surface bounded by (111) B oriented cyrstalline side surfaces.

9. The method of claim 4 in which the first semiconductor layer is of GaAs grown by molecular beam epitaxy (MBE) using a molecular beam source of $As_4$ and Ga.

10. The method of claim 9 in which said first semiconductor layer is grown as a trapezoid having a (100) oriented crystalline plane top surface bounded by (111) B oriented crystalline plane side surfaces.

11. The method of claim 1 wherein said providing step comprises:

growing said second semiconductor layer as a GaAs layer grown to a thickness of about 20 nm by molecular beam epitaxy (MBE) using a molecular beam source of $As_2$ and Ga where the first semiconductor layer is of AlGaAs.

12. The method of claim 11 in which the second semiconductor layer is grown as a trapezoid having a (100) oriented crystalline plane top surface bounded by (111) B oriented crystalline side surfaces.

13. The method of claim 1 wherein said providing step comprises:

growing said second semiconductor layer as an InGaAs layer grown to a thickness of about 10 nm by molecular beam epitaxy (MBE) using a molecular beam source of $As_2$ and Ga and In where the first semiconductor layer is of GaAs.

14. The method of claim 13 in which the second semiconductor layer is grown as a trapezoid having a (100) oriented crystalline top surface bounded by (111) B oriented crystalline side surfaces.

15. The method of claim 1, wherein said deposing step comprises:

growing said third conformal semiconductor layer as an AlGaAs layer grown by using a molecular beam source of $As_4$ and Ga and Al where the second semiconductor layer is of GaAs.

16. The method of claim 1, wherein said deposing step comprises:

growing said third conformal semiconductor layer as an AlGaAs layer grown by migration enhancement epitaxy (MEE) using a molecular beam source of $As_2$ and Ga and Al where the second semiconductor layer is of GaAs.

17. The method of claim 1, wherein said deposing step comprises:

growing said third conformal semiconductor layer as a GaAs layer grown by using a molecular beam source of $As_4$ and Ga where the second semiconductor layer is of InGaAs.

* * * * *